US009620822B2

(12) United States Patent
Cheng et al.

(10) Patent No.: US 9,620,822 B2
(45) Date of Patent: Apr. 11, 2017

(54) BATTERY CHARGING METHOD TO OBTAIN A CHARGING CURRENT USING FUZZIFICATION AND DEFUZZIFICATION

(71) Applicant: Industrial Technology Research Institute, Chutung, Hsinchu County (TW)

(72) Inventors: Cheng-Hung Cheng, Chutung (TW); Yi-Hua Liu, Chutung (TW)

(73) Assignee: Industrial Technology Research Institute, Chutung, Hsinchu County (TW)

( * ) Notice: Subject to any disclaimer, the term of this patent is extended or adjusted under 35 U.S.C. 154(b) by 254 days.

(21) Appl. No.: 14/559,356

(22) Filed: Dec. 3, 2014

(65) Prior Publication Data

US 2016/0072318 A1 Mar. 10, 2016

(30) Foreign Application Priority Data

Sep. 10, 2014 (TW) .............................. 103131116 A

(51) Int. Cl.
H01M 10/44 (2006.01)
G01R 31/36 (2006.01)

(52) U.S. Cl.
CPC ....... H01M 10/443 (2013.01); G01R 31/3651 (2013.01)

(58) Field of Classification Search
CPC .................................................. H01M 10/443
USPC .................................................. 320/152–153
See application file for complete search history.

(56) References Cited

U.S. PATENT DOCUMENTS 6,011,379 A * 1/2000 Singh .................. B60L 11/1881
320/132
6,204,641 B1 * 3/2001 Sakakibara ........... H02J 7/0091
320/150
7,072,871 B1 * 7/2006 Tinnemeyer ....... G01R 31/3651
320/132
7,888,913 B1 2/2011 Marty et al.
8,040,110 B2 * 10/2011 Al-Anbuky ........... H02J 7/0072
320/150

(Continued)

FOREIGN PATENT DOCUMENTS

CN 1521914 A 8/2004
CN 101908827 A 12/2010

(Continued)

OTHER PUBLICATIONS

Aykin, Eren et al., "A fuzzy classifieer based on correlation matrix memories", 2009, FS'09 Proceedings of the 10th WSEAS international conference on fuzzy systems., pp. 63-68.*

(Continued)

Primary Examiner — Stacy Whitmore
(74) Attorney, Agent, or Firm — McCarter & English, LLP; Yu Lu

(57) ABSTRACT

The present disclosure provides a method for charging a battery. The method receives a plurality of battery parameters during the period of the battery charging, and the plurality of battery parameters are turned into fuzzification and corresponded to fuzzy rules to map out a fuzzy output. Then the fuzzy output is turned into defuzzification to obtain the value of the charging current. Therefore, the present disclosure can change the charging current adaptively to enhance the charging effect.

9 Claims, 2 Drawing Sheets

(56) References Cited

U.S. PATENT DOCUMENTS

| | | | | |
|---|---|---|---|---|
| 8,332,169 | B2* | 12/2012 | Kang | G01R 31/3679 320/127 |
| 8,738,311 | B2* | 5/2014 | Wu | G01R 31/3651 702/108 |
| 2003/0074335 | A1* | 4/2003 | Singh | G01R 31/3651 706/2 |
| 2015/0149799 | A1* | 5/2015 | Ye | G06F 1/263 713/320 |

FOREIGN PATENT DOCUMENTS

| | | |
|---|---|---|
| CN | 103700901 A | 4/2014 |
| TW | 451512 B | 8/2001 |
| TW | I320977 B | 2/2010 |
| TW | 201224485 A | 6/2012 |
| TW | I416840 B | 11/2013 |
| TW | 201428511 A | 7/2014 |

OTHER PUBLICATIONS

Ali Zenati, Philippe Desprez, Hubert Razik. Estimation of the SOC and the SOH of li-ion batteries, by combining impedance measurements with the fuzzy logic inference. IECON 2010, Nov. 2010, Glendale, United States. pp. 1767-1772, 2010, <10.1109/IECON. 2010.5675408>. <hal-00564335>.*

Shi, Yan et al., "A learning algorithm for tuning fuzzy inference rules", 1999, IEEE International Fuzzy systems conference proceedings., pp. I-3778-I382.*

Lofti, A. et al., "Matrix formulation of fuzzy rule based systems", Apr. 1996, IEEE transactions on systems, man, and cybernetics—Part B: Cybernetics, vol. 26, No. 2, pp. 332-340.*

Chen et al., "Current-Pumped Battery Charger," *IEEE Trans. Ind. Electron.*, 55(6):2482-2488 (2008).

Chen, "PLL-Based Battery Charge Circuit Topology," *IEEE Trans Ind. Electron.*, 51(6):1344-1346 (2004).

Dung and Yen, "ILP-Based Algorithm for Lithium-Ion Battery Charging Profile," *IEEE International Symposium on Industrial Electronics (ISIE)*, pp. 2286-2291 (2010).

Huang et al., "Fuzzy-Control-Based Five-Step Li-Ion Battery Charge," *IEEE International Conference on Power Electronics and Drive Systems (PEDS)*, pp. 1547-1551 (2009).

Liu and Luo, "Search for an Optimal Rapid-Charging Pattern for Li-Ion Batteries Using Taguchi Approach," *IEEE Trans Ind. Electron.*, 57(12):3963-3971 (2010).

CN 1521914 English abstract.
CN 101908827 English abstract.
CN 103700901 English abstract.
TW 201131931 English abstract.
TW 451512 English abstract.
TW I320977 English abstract.

Chen et al., "Fast Estimation of State of Charge for Lithium-ion Battery," 2014 Intl. Symposium on Computer, Consumer and Control, *IEEE*, pp. 284-287 (2014).

TW 201224485 English abstract.
TW 201428511 English abstract.

* cited by examiner

BATTERY CHARGING METHOD TO OBTAIN A CHARGING CURRENT USING FUZZIFICATION AND DEFUZZIFICATION

CROSS-REFERENCE TO RELATED APPLICATIONS

This application claims foreign priority under 35 U.S.C. §119(a) to patent application Ser. No. 10/313,1116, filed on Sep. 10, 2014, in the Intellectual Property Office of Ministry of Economic Affairs, Republic of China (Taiwan, R.O.C.), the entire content of which patent application is incorporated herein by reference.

BACKGROUND OF THE INVENTION

1. Technical Field

This disclosure relates to methods of charging a battery, and, more particularly, to a fuzzy control method of charging a battery.

2. Description of Related Art

Due to awakening of the concept of environmental protection and the demand of energy saving, there is a rising trend of research on charging techniques for the rechargeable battery in order to obtain more efficient means of charging a battery. Currently many charging techniques for the rechargeable battery have been developed, among which are Constant Voltage (CV) method, Constant Current (CC) method, a two-step CC-CV method, pulse charging method, etc.

These charging methods have their respective pros and cons. For example, the CV method requires two to three times more charging time to complete charging the last 20 percent than it takes to charge up the first 80 percent for the battery. The CC-method, on the other hand, tends to undercharge or over-charge, causing irreversible damage to the battery. The two-step method depends its efficiency and charging time on its configured voltage and current, and generally, takes longer time. The pulse method has difficulties on fixating certain charging rules due to variations on parameters such as amplitude, frequency and quiescent time with respect to different makes and models of batteries.

Nevertheless, all the methods are challenged by rise of temperature and are all unable to complete charging in short period of time. Therefore, it remains one of the imminent problems to cope with excessive temperature rise, reduce charging time, and increase charging efficiency for the rechargeable batteries.

SUMMARY OF THE INVENTION

The current disclosure provides a method for charging a battery, comprising: measuring a plurality of battery parameters of a battery when the battery is charged, the battery parameters including a surface temperature and a remaining charging capacity of the battery; turning the battery parameters into fuzzification and to correspond to fuzzy rules; and performing a defuzzification algorithm according to the fuzzified battery parameters and the fuzzy rules to obtain a value of a charging current.

BRIEF DESCRIPTION OF THE DRAWINGS

The disclosure can be fully understood by reading the following detailed description of the preferred embodiments, with reference made to the accompanying drawings.

DETAILED DESCRIPTION OF THE INVENTION

Figure 1:
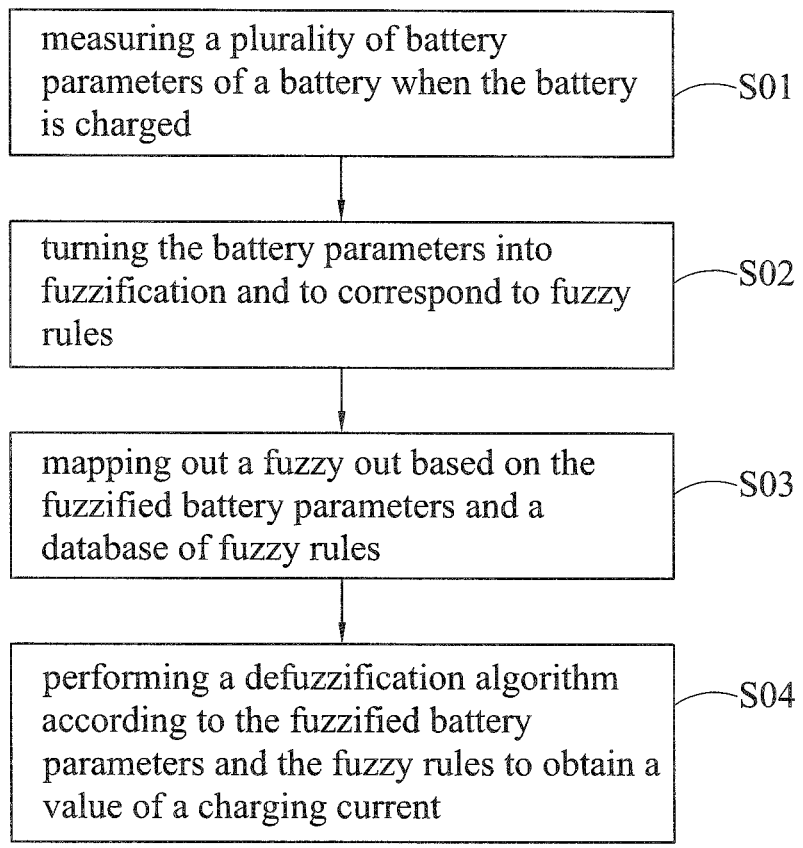
FIG. 1 shows a flow chart of a method for charging a battery according to the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The method for charging a battery according to present disclosure relates to improving the charging methods of a lithium battery in order to adapt the charging current to battery conditions, mitigate excessive increase on temperature during the charging phase, and reduce the charging time to increase charging efficiency.

Please refer to FIG. 21, which is a flow chart of a method for charging a battery according to present disclosure. In step S01, a charging current is obtained from an external power source. The charging current charges a rechargeable battery.

When the battery is being charged, a plurality of battery parameters are measured by sensors. The battery parameters include the battery's surface temperature difference and remaining capacity (State of Charge, SOC).

The surface temperature difference of the battery refers to a difference of surface temperatures measured at two consecutive seconds for the Lithium battery.

When the battery's surface temperature difference and SOC are obtained, the method according to present disclosure uses these two parameters to adaptively alter the charging current of the battery through fuzzification afterwards. Prior to fuzzy control, a database of fuzzy rules must be established beforehand. The data sources of the database of fuzzy rules come from historical material or experimental data, such as surface temperature difference, SOC, and the corresponding charging current. The database of fuzzy rules binds to a fuzzy correlation matrix established by a plurality of surface temperature differences, a plurality of subsets of SOC, and a plurality of charging currents.

Figure 2:
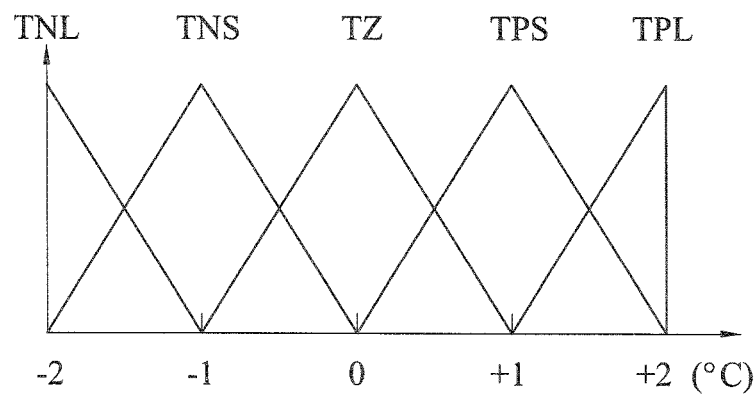
FIG. 2 shows the distribution of the input membership functions of the method according to the present disclosure.

In an embodiment, as shown in FIG. 2, five fuzzy subsets of surface temperature of the battery are shown, including Temperature-Negative-Large (TNL), Temperature-Negative-Small (TNS), Temperature-Zero (TZ), Temperature-Positive-Small (TPS), and Temperature-Positive-Large (TPL). These fuzzy subsets have five respective representative intermediate values that equal to −2° C., −1° C., 0° C., 1° C. and 2° C., respectively, which are configured to set the variation of battery temperature between −2° C. and 2° C.

Figure 3:
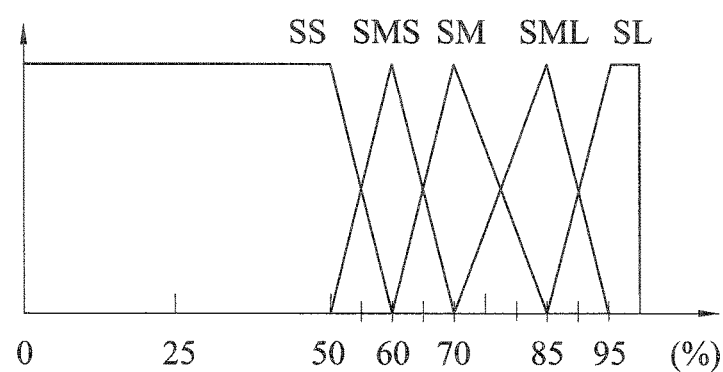
FIG. 3 shows the distribution of the input membership functions of the remaining capacity of the battery for the methods according to the present disclosure.

As shown in FIG. 3, the remaining capacity also has five fuzzy subsets that have five respective representative intermediate values, which equal to 50%, 60%, 70%, 85% and 95%, respectively, and are configured to set the SOC in between 50% and 95%. This allows the current levels to be adjusted by large degrees of variation. The five fuzzy subsets are SOC-Small (SS), SOC-Medium-Small (SMS), SOC-Medium (SM), SOC-Medium-Large (SML), and SOC-Large (SL).

Figure 4:
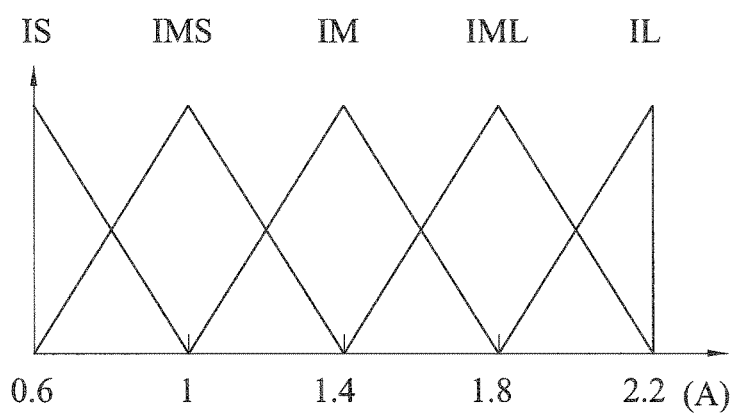
FIG. 4 shows the output membership functions of the charging current for the method according to the present disclosure.

As shown in FIG. 4, these fuzzy subsets of the charging current include Lout-Small (LS), Lout-Medium-Small (LMS), Lout-Medium (LM), Lout-Medium-Large (LML), and Lout-Large (LL), and have their respective representative intermediate values that equal to 0.6, 1.0, 1.4, 1.8 and 2.2 amps, respectively.

An input indicator function of the surface temperature difference and SOC aforementioned is a triangle. The present disclosure's membership functions can be, but not limited to, the form of triangle, trapezoid, Gauss functions, and Bell-shaped functions.

The present disclosure does not put a limit on the number of subsets and corresponding representative intermediate values.

The present disclosure can adjust the number of fuzzy subsets and respective representative intermediate values according to needs.

Therefore, the fuzzy correlation matrix can be established with surface temperature difference, SOC, and a plurality of fuzzy subsets of the charging current. The fuzzy correlation matrix is shown in Table 1.

TABLE 1

| SOC | DT | | | | |
|---|---|---|---|---|---|
| | TNL | TNS | TZ | TPS | TPL |
| SS | IL Rule 1 | IL Rule 2 | IML Rule 3 | IM Rule 4 | IM Rule 5 |
| SMS | IL Rule 6 | IML Rule 7 | IM Rule 8 | IM Rule 9 | IMS Rule 10 |
| SM | IML Rule 11 | IM Rule 12 | IM Rule 13 | IMS Rule 14 | IMS Rule 15 |
| SML | IM Rule 16 | IM Rule 17 | IMS Rule 18 | IMS Rule 19 | IS Rule 20 |
| SL | IM Rule 21 | IMS Rule 22 | IMS Rule 23 | IS Rule 24 | IS Rule 25 |

The above fuzzy correlation matrix is obtained according to trialed results of lithium batteries. Because lithium battery charges exothermically, when the surface temperature difference is less than or equal to zero (e.g., TNL, TNS or TZ), according to concept of chemical equilibrium, sufficient amount of substrate in the chemical reaction is normally implied, resulting in a higher reaction rate constant and consequently is likely to thoroughly react, allowing a greater charging current. When the surface temperature difference is greater than zero (e.g., TPS, TPL), insufficient amount of substrate for chemical reaction is normally implied and consequently, lower reaction rate constant makes forward reaction unlikely.

On the other hand, the SOC raises together with the degree of saturation of the battery. When SOC is high, the battery capacity is nearly saturated and therefore forward chemical reaction is harder to take place. This generally implies imbalance of a chemical reaction, which leads to possible non-uniform or unexpected products. This scenario has a potential to cause pressure, deformity, and explosion on devices. For this reason, the reaction rate has to be reduced when SOC reaches its maximum rating of operation, in order to ensure proper chemical reaction and balance between substrates and products. As a result, the charging current must be reduced when the SOC is large. The IS is the smallest under a joined condition of TPL and SL. IL has its maximum value under a joined condition of TNL and SS.

In step S02, the plurality of parameters measured for the battery are fuzzified. The fuzzified parameters are mapped onto the fuzzy rules database. A projected fuzzy output is obtained subsequently. The above steps in the present paragraph form the procedures of the inference engine. That is: treat surface temperature difference and SOC as Non-Fuzzy Inputs, fuzzify the inputs, map results into the fuzzy rules database, and then conduct projection with the inference engine. In this embodiment, the inference engine applies minimum inference, maximum inference, maximum multiplication inference or maximum boundary inference. But applications of current disclosure are not limited to these approaches.

In this embodiment, when minimum inference projects fuzzy outputs, intersection of the pluralities of surface temperature difference fuzzy subsets and SOC fuzzy subsets is taken. For example, after measurement and fuzzification of surface temperature difference and SOC yield TNS and SM respectively, a conclusion can be drawn from FIG. 2 to state that TNS takes on a triangular membership function whose left and right boundary temperatures are −2° C. and 0° C., respectively. Another conclusion can be drawn from FIG. 3 to state that SM takes on a triangular membership function whose left and right boundary values are 60% and 85%. Once TNS and SM fuzzy subsets are extracted, minimum inference engine can further extract the intersection the fuzzy subsets. When the above table 1 is referred for the fuzzy rules database, a charging current, IM Rule 12 is obtained as the fuzzy output.

In step S04, the fuzzy output is defuzzified to obtain numerical values of the charging current. The defuzzified algorithms includes medium-average method, maximum-average method, area-centroid method, and center-of-mass method. The current disclosure includes but does not limit its application to said methods. Take area-centroid method for example, the triangular membership function of the fuzzy output obtained for the charging current IM Rule 12 is taken as the weight of the output fuzzy subsets (e.g., in FIG. 4), IM takes on a triangular membership function with left and right boundary values at 1 and 1.8). Subsequently defuzzification is proceeded with center-of-mass method, whose formula is given below:

$$s = \frac{\sum_{i=1}^{i=n} \mu_i X_i(\max)}{\sum \mu_i}$$

Where $\mu_i$, $X_i$ and s are weight of discrete fuzzy subset outputs, element values, and center-of-mass. At the end, center-of-mass can be solved and corresponding charging current values can be obtained for Non-Fuzzy Output.

To sum up, the charging current according to the present disclosure can be altered with battery conditions in real time. Customized charging control can be achieved by providing different charging current with the same model of the battery of the same make. This mitigates excessive rise of temperature effectively, enhances charging efficacy, reduces charging time, and henceforth prolongs battery life. Comparing the charging method of current disclosure with other charging methods in tables 2 and 3 below, the advantages and efficacy is proven evident.

TABLE 2

| | CC-CV charging method | | | | The battery charging method according to the present disclosure | | | |
|---|---|---|---|---|---|---|---|---|
| Number of tests | Charging time (sec) | Charging capacity (Ah) | Discharging capacity (Ah) | Charging efficiency (%) | Charging time (sec) | Charging capacity (Ah) | Discharging capacity (Ah) | Charging efficiency (%) |
| 1 | 7376 | 4.650 | 4.456 | 95.84 | 8765 | 4.661 | 4.549 | 97.6 |
| 2 | 7392 | 4.662 | 4.452 | 95.51 | 8849 | 4.663 | 4.558 | 97.75 |
| 3 | 7403 | 4.646 | 4.455 | 95.90 | 8839 | 4.651 | 4.562 | 98.09 |
| Average | 7390 | 4.653 | 4.455 | 95.75 | 8818 | 4.658 | 4.556 | 97.81 |

TABLE 3

| | CC-CV charging method | | The battery charging method according to the present disclosure | |
|---|---|---|---|---|
| Number of tests | Maximum temperature increase (° C.) | Average temperature increase (° C.) | Maximum temperature increase (° C.) | Average temperature increase (° C.) |
| 1 | 9.382 | 5.451 | 6.634 | 3.879 |
| 2 | 9.567 | 5.547 | 6.310 | 3.661 |
| 3 | 9.495 | 5.551 | 6.500 | 3.839 |
| average | 9.481 | 5.516 | 6.481 | 3.793 |

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for charging a battery, comprising:
   measuring a plurality of battery parameters of a battery when the battery is charged, the battery parameters including a surface temperature and a remaining charging capacity of the battery;
   turning the battery parameters into fuzzification and to correspond to fuzzy rules, wherein the fuzzy rule base is a fuzzy correlation matrix established by a plurality of fuzzy subsets of the surface temperature, a plurality of fuzzy subsets of the remaining charging capacity, and a plurality of fuzzy subsets of the charging current; and
   performing a defuzzification algorithm according to the fuzzified battery parameters and the fuzzy rules to obtain a value of a charging current.

2. The method of claim 1, wherein the surface temperature difference has five fuzzy subsets that have five respective representative intermediate values equal to −2° C., −1° C., 0° C., 1° C. and 2° C., respectively.

3. The method of claim 1, wherein the remaining capacity has five fuzzy subsets that have five respective representative intermediate values equal to 50%, 60%, 70%, 85% and 95%, respectively.

4. The method of claim 1, wherein the charging current has five fuzzy subsets that have five respective representative intermediate values equal to 0.6, 1.0, 1.4, 1.8 and 2.2 amps, respectively.

5. The method of claim 1, further comprising, prior to performing the defuzzification algorithm, providing an inference engine that maps out a fuzzy output according to the fuzzified battery parameters and the fuzzy rules, and performing the defuzzification algorithm on the fuzzy output.

6. The method of claim 5, wherein the inference engine is minimum inference, maximum inference, maximum product inference, or maximum boundary inference.

7. The method of claim 6, wherein the minimum inference is used to map out the fuzzy output based on an intersection range of the fuzzy subsets of the surface temperature and the fuzzy subsets of the remaining charging capacity.

8. The method of claim 1, wherein the defuzzification algorithm is a center average method, a maximum average method, a center-of-gravity method, or a center-of-sum method.

9. The method of claim 1, wherein the surface temperature is a difference of temperatures of a surface of the battery measured at two consecutive seconds.

* * * * *